(12) United States Patent
Shin et al.

(10) Patent No.: US 8,208,280 B2
(45) Date of Patent: Jun. 26, 2012

(54) NONVOLATILE MEMORY DEVICE

(75) Inventors: Chang-Hee Shin, Cheongju-si (KR);
Ki-Seok Cho, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 345 days.

(21) Appl. No.: 12/418,822

(22) Filed: Apr. 6, 2009

(65) Prior Publication Data

US 2009/0262567 A1    Oct. 22, 2009

(30) Foreign Application Priority Data

Apr. 16, 2008 (KR) .................. 10-2008-0035208

(51) Int. Cl.
*G11C 17/00* (2006.01)
(52) U.S. Cl. ........... 365/96; 365/94; 365/226; 365/104; 365/100; 365/174; 365/186; 365/189.09
(58) Field of Classification Search .................. 365/96, 365/94, 226, 104, 100, 174, 186, 102, 149, 365/189.09
See application file for complete search history.

(56) References Cited

U.S. PATENT DOCUMENTS

| | | | |
|---|---|---|---|
| 6,044,012 A * | 3/2000 | Rao et al. | 365/182 |
| 6,424,585 B1 * | 7/2002 | Ooishi | 365/226 |
| 7,215,143 B1 * | 5/2007 | Chung et al. | 326/68 |
| 7,535,786 B1 * | 5/2009 | Walker | 365/222 |
| 2003/0021148 A1 * | 1/2003 | Scheuerlein | 365/175 |
| 2006/0092742 A1 | 5/2006 | Paillet et al. | |
| 2008/0055965 A1 * | 3/2008 | Eftimie et al. | 365/149 |

OTHER PUBLICATIONS

A 4Mb 0.18um 1T1MTJ Toggle MRAM memory to Nahas et al., 2004 IEEE International, 2004 ISSCC, vol. 47, pp. 44-45.*

* cited by examiner

*Primary Examiner* — Fernando Hidalgo
(74) *Attorney, Agent, or Firm* — NSIP Law (57) ABSTRACT

A nonvolatile memory device including one-time programmable (OTP) unit cell is provided. The nonvolatile memory device includes: a unit cell; a detecting unit configured to detect data from the unit cell; and a read voltage varying unit configured to vary an input voltage and supply a varied read voltage to the unit cell.

43 Claims, 9 Drawing Sheets

NONVOLATILE MEMORY DEVICE

CROSS-REFERENCE TO RELATED APPLICATIONS

This application claims the benefit under 35 U.S.C. §119 (a) of Korean Patent Application No. 10-2008-0035208, filed on Apr. 16, 2008, the entire disclosure of which is incorporated herein by reference for all purposes.

BACKGROUND OF THE INVENTION

1. Field of the Invention

The following description relates to a semiconductor design technology; and, more particularly, to a nonvolatile memory device including one-time programmable (OTP), unit cell.

2. Description of Related Art

One-time programmable (OTP) unit cells are formed inside a volatile or nonvolatile memory device, such as DRAM, EEPROM or flash memory, and are used for memory repair purpose. In addition, OTP unit cells are used for internal operating voltage and frequency trimming in a mixed-signal chip where an analog chip and a digital chip are mixed.

Generally, each OTP unit cell includes an antifuse implemented with a metal-oxide-semiconductor field effect transistor (MOSFET), which will be referred to as a MOS transistor, and one or more MOS transistors. Such an OTP unit cell is formed inside each memory chip in a single or array configuration and is used for repair or trimming.

Figure 1:
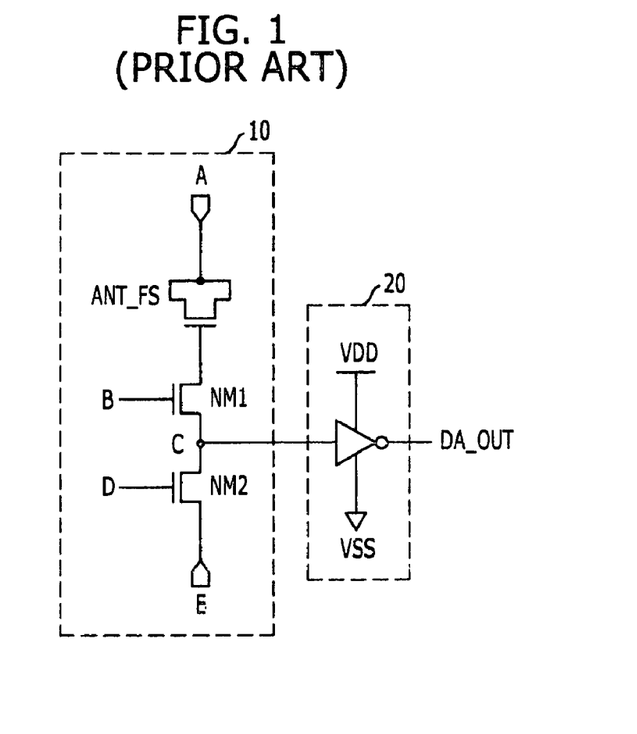
FIG. 1 is a circuit diagram of a conventional nonvolatile memory device.

FIG. 1 is an equivalent circuit diagram for explaining a conventional nonvolatile memory device including an OTP unit cell.

Referring to FIG. 1, the conventional nonvolatile memory device includes an OTP unit cell 10 and a detecting unit 20. The OTP unit cell 10 includes an antifuse ANT_FS, an n-channel transistor NM1 connected between the antifuse ANT_FS and an output terminal C (an output terminal through which data is outputted in a read operation), and an n-channel transistor NM2 connected between the output terminal C and a fourth input terminal E. The detecting unit 20 is configured with an inverter.

The following description will be made on read and write operations of the conventional nonvolatile memory device.

TABLE 1

| Mode | Terminal (Node) | | | | | |
|---|---|---|---|---|---|---|
| | A | B | D | E | C | DA_OUT |
| Write Operation | Ground Voltage | H | H | High Voltage | — | — |
| Read Operation | Ground Voltage | H | H | Power Supply Voltage | L | H |

Write Operation

First, a ground voltage is applied to a first input terminal A, and a high voltage is applied to a fourth input terminal E. Also, a signal having a logic level corresponding to a power supply voltage, which will be referred to as a logic high signal hereinafter, is applied to a second input terminal B and a third input terminal D. Accordingly, a gate dielectric breakdown occurs due to a high electric field formed between a substrate and a gate of the antifuse ANT_FS implemented with the MOS transistor. Thus, the gate of the antifuse ANT_FS and the substrate are electrically shorted.

Read Operation

After the write operation, the ground voltage is applied to the first input terminal A, and the power supply voltage is applied to the fourth input terminal E. A logic high signal is inputted to the second input terminal B and the third input terminal D. Accordingly, a current path is formed from the first input terminal A to the fourth input terminal E through the antifuse ANT_FS, the first transistor NM1 and the second transistor NM2. Thus, a logic level corresponding to the ground voltage (hereinafter, referred to as a logic low level) is outputted through the output terminal C.

However, the conventional nonvolatile memory device has the following limitations.

In the conventional nonvolatile memory device, if the antifuse does not stably break down in the read operation and thus the unit cell has high resistance, the detecting unit 20 implemented with the inverter cannot accurately detect the data in the read operation due to a narrow sensing margin of data detected through the output terminal C. Therefore, the inaccurate data detection degrades the reliability in the read operation of the nonvolatile memory device.

SUMMARY OF THE INVENTION

An example is directed to a nonvolatile memory device which may be capable of preventing malfunctions caused by high resistance of a unit cell in a read operation and, as a result, improving the reliability of the read operation.

In one general aspect, there is provided a nonvolatile memory device, including: a unit cell; a detecting unit configured to detect data from the unit cell; and a read voltage varying unit configured to vary an input voltage and supply a varied read voltage to the unit cell.

In another general aspect, there is provided a nonvolatile memory device, including: a cell array including a plurality of unit cells arranged in a matrix type; a plurality of data lines commonly connected to output terminals of the unit cells; a plurality of detecting units configured to detect data from the data lines; and a read voltage varying unit configured to vary an input voltage and supply a varied read voltage to the data lines.

In another general aspect, there is provided a nonvolatile memory device, including: a cell array including a plurality of unit cells arranged in a matrix type; a plurality of data lines commonly connected to output terminals of the unit cells; a plurality of detecting units configured to detect data from the data lines; and a read voltage varying unit configured to vary an input voltage and supply a varied read voltage to the data lines.

Other features and aspects may be understood by the following description, the drawings, and the claims.

DETAILED DESCRIPTION

Features and aspects may become apparent from the following description of example embodiments with reference to the accompanying drawings, which is set forth hereinafter. Furthermore, the term "transistor" described throughout this specification refers to a switching element operating in response to a control signal inputted to its gate. For example, examples of the transistor include a junction field effect transistor (JFET) and a metal-oxide-semiconductor field effect transistor (MOSFET). Moreover, like reference numerals or symbols refer to like elements throughout.

Embodiment

Figure 2:
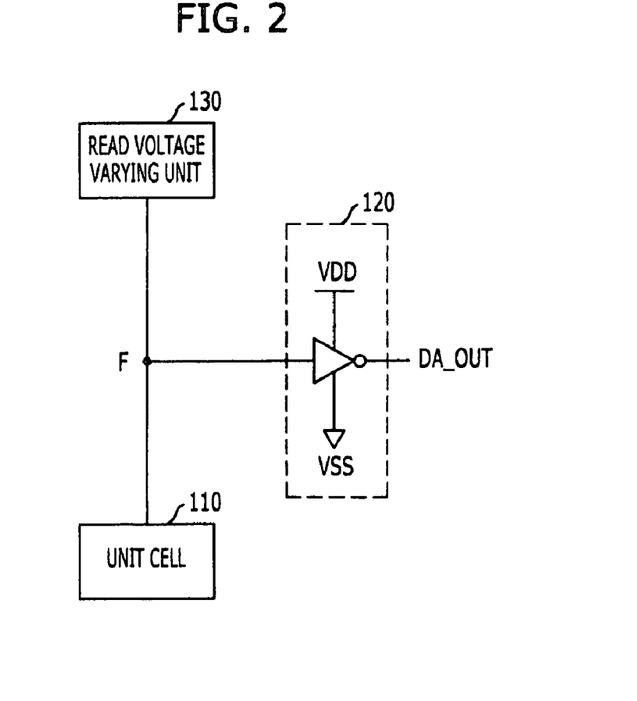
FIG. 2 is a configuration diagram illustrating an example of a nonvolatile memory device.

FIG. 2 is a configuration diagram illustrating an example of a nonvolatile memory device.

Referring to FIG. 2, an example of the nonvolatile memory device includes a unit cell 110, a detecting unit 120, and a read voltage varying unit 130. The detecting unit 120 detects data from the unit cell 110. The read voltage varying unit 130 varies an input voltage and supplies a read voltage having a varied level to the unit cell 110.

Figure 3:
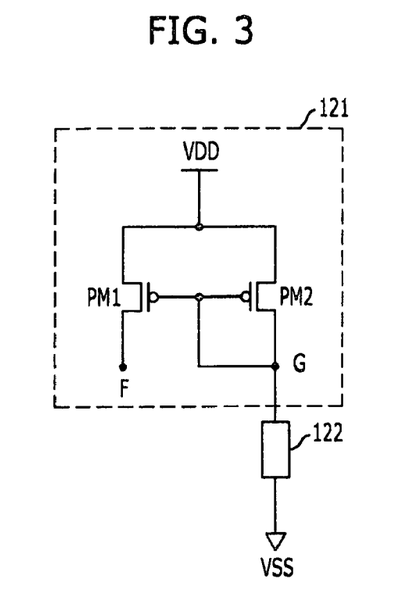
FIG. 3 is a circuit diagram of a read voltage varying unit (130) of FIG. 2.

Referring to FIG. 3, the read voltage varying unit 130 includes a first current mirror 121 and a variable current supplying unit 122. The first current mirror 121 receives a power supply voltage as the input voltage and supplies the read voltage to the unit cell 110. The variable current supplying unit 122 supplies a variable current or a variable voltage to an input terminal G of the first current mirror 121.

The first current mirror 121 includes a first transistor PM1 and a second transistor PM2. The first transistor PM1 is connected between a power supply voltage terminal VDD and an output terminal F of the unit cell 110. The second transistor PM2 is connected between the output terminal G of the variable current supplying unit 122 (the input terminal of the first current mirror 121) and the power supply voltage terminal VDD. Also, a gate of the second transistor PM2 and a gate of the first transistor PM1 are commonly connected to the input terminal G of the first current mirror 121. In this case, the first transistor PM1 and the second transistor PM2 may be implemented with p-channel transistors having more excellent driving characteristics than n-channel transistors.

The variable current supplying unit 122 supplies the variable current varying the potential of the input terminal G of the first current mirror 121 in order to control the operation of the first current mirror 121. To this end, the variable current supplying unit 122 includes a variable resistor whose resistance is varied by a plurality of control signals.

Figure 4:
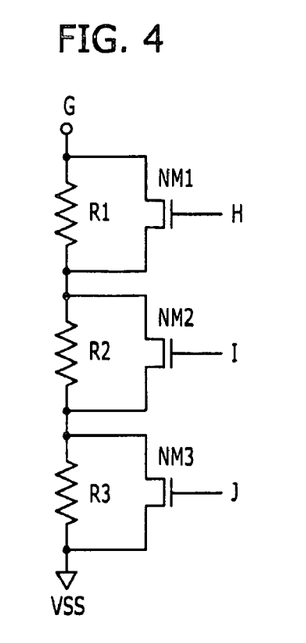
FIGS. 4 to 9 are circuit diagrams of a variable current supplying unit 122 of FIG. 3.

To take an example, as illustrated in FIG. 4, the variable current supplying unit 122 includes a plurality of resistors R1 to R3 connected in series between the input terminal G of the first current mirror 121 and the ground voltage terminal VSS, and a plurality of first switching units NM1 to NM3 connected in parallel to the plurality of resistors R1 to R3, respectively. The first switching units NM1 to NM3 are implemented with transistors operating in response to control signals H, I and J inputted to their gates. More specifically, the first switching units NM1 to NM3 are implemented with n-channel transistors. There is no limitation in the number of the resistors R1 to R3 and the first switching units NM1 to NM3.

Figure 5:
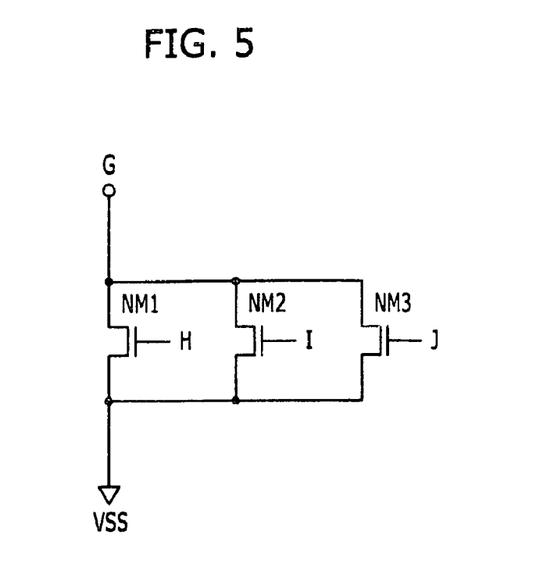

As another example, as illustrated in FIG. 5, the variable current supplying unit 122 includes a plurality of transistors NM1 to NM3 connected in parallel between the input terminal G of the first current mirror 121 and the ground voltage terminal VSS. There is no limitation in the number of the transistors NM1 to NM3. Furthermore, the plurality of transistors NM1 to NM3 have the same or different length width and length so that they have the same or different resistances according to the control signals H, I and J inputted to their gates.

Figure 6:
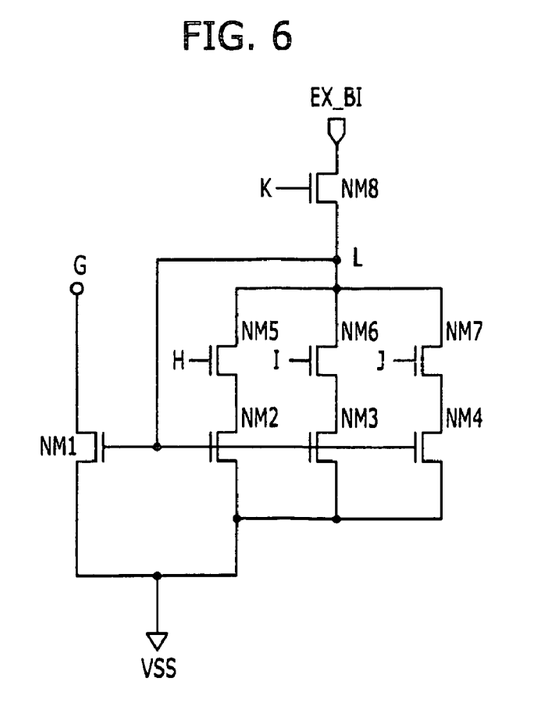
Figure 7:
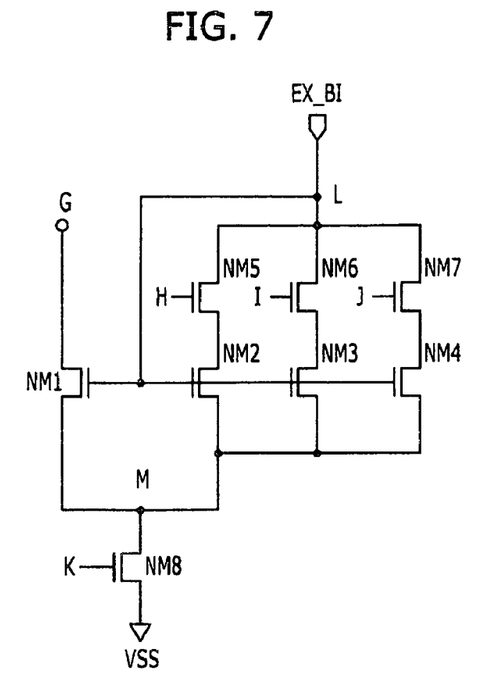

As another example, as illustrated in FIGS. 6 and 7, the variable current supplying unit 122 includes a second current mirror receiving an external bias EX_BI and supplying a variable current to the input terminal G of the first current mirror 121 in response to a plurality of control signals H, I, J and K. In this case, the external bias EX_BI is a fixed voltage or current which is applied with a constant magnitude without being varied.

Referring to FIG. 6, the variable current supplying unit 122 includes a third transistor NM1, a plurality of fourth transistors NM2 to NM4, a plurality of first switching units NM5 to NM7, and a second switching unit NM8. The third transistor NM1 is connected between the input terminal G of the first current mirror 121 and the ground voltage terminal VSS, and has a gate connected to a first node L.

The plurality of fourth transistors NM2 to NM4 are connected in parallel between the first node L and the ground voltage terminal VSS, and have gates commonly connected to the gate of the third transistor NM1, which is connected to the first node L. The plurality of first switching units NM5 to NM7 are connected in series between the respective fourth transistors NM2 to NM4 and the first node L, and transfer the external bias EX_BI from the first node L to the fourth transistors NM2 to NM4. The second switching unit NM8 transfers the external bias EX_BI to the first node L.

Referring to FIG. 7, as another example, the variable current supplying unit 122 includes a third transistor NM1, a plurality of fourth transistors NM2 to NM4, a plurality of first switching units NM5 to NM7, and a second switching unit NM8. The third transistor NM1 is connected between the input terminal G of the first current mirror 121 and a first node M, and has a gate connected to a second node L.

The plurality of fourth transistors NM2 to NM4 are connected in parallel between the first node M and the second node L, and have gates commonly connected to the gate of the third transistor NM1, which is connected to the second node L. The plurality of first switching units NM5 to NM7 are connected in series between the respective fourth transistors NM2 to NM4 and the second node L, and transfer the external bias EX_BI from the second node L to the fourth transistors NM2 to NM4. The second switching unit NM8 is connected between the first node M and the ground voltage terminal VSS.

In FIGS. 6 and 7, the third and fourth transistors NM1 to NM4 are implemented with n-channel transistors and have the same or different channel width and length so that they have the same or different resistances. Furthermore, the first and second switching units NM5 to NM8 are implemented with n-channel transistors operating in response to the control signals H, I, J and K inputted to their gates. In this case, there is no limitation in the number of the fourth transistors NM2 to NM4 and the first switching units NM5 to NM7.

Figure 8:
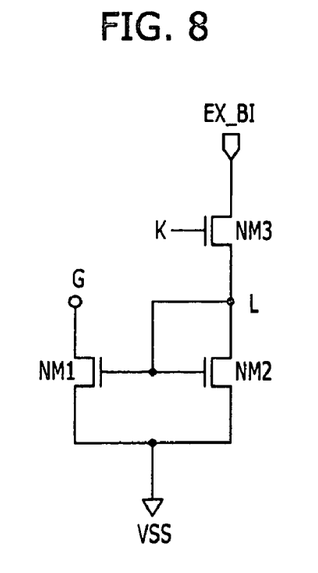
Figure 9:
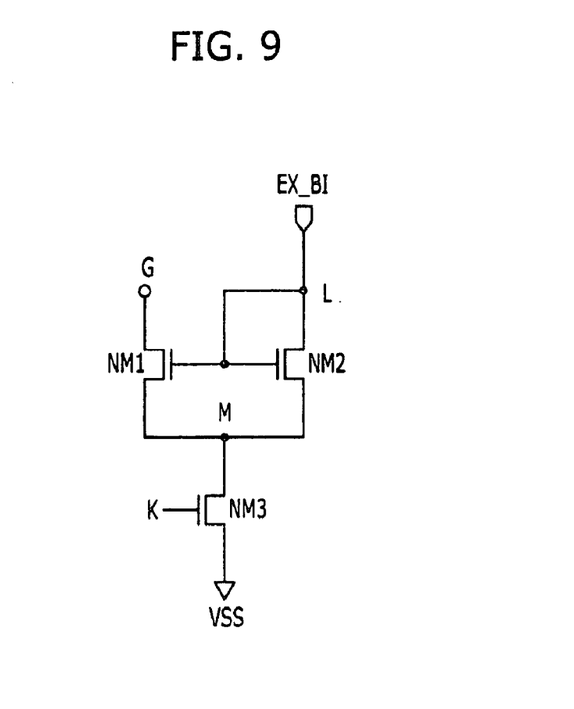

As another example, as illustrated in FIGS. 8 and 9, the variable current supplying unit 122 includes a second current mirror receiving a variable external bias EX_BI and supplying a variable current to the input terminal G of the first current mirror 121. The external bias EX_BI used herein is a variable voltage, not a fixed voltage having a constant level like the external bias described with reference to FIGS. 6 and 7. For example, the variation width is determined in 0.1 V to 1 V within a range of 1 V to 5 V.

Referring to FIG. 8, the variable current supplying unit 122 includes a third transistor NM1, a fourth transistor NM2, and a first switching unit NM3. The third transistor NM1 is connected between the input terminal G of the first current mirror 121 and the ground voltage terminal VSS, and has a gate connected to a first node L. The fourth transistor NM2 is connected between the first node L and the ground voltage terminal VSS, and has a gate connected to the gate of the third transistor NM1, which is connected to the first node L. The first switching unit NM3 transfers an external bias EX_BI from the first node L to the fourth transistor NM2.

Referring to FIG. 9, the variable current supplying unit 122 includes a third transistor NM1, a fourth transistor NM2, and a first switching unit NM3. The third transistor NM1 is connected between the input terminal G of the first current mirror 121 and a first node M, and has a gate connected to a second node L. The fourth transistor NM2 is connected between the first node M and the second node L to which an external bias EX_BI is inputted, and has a gate connected to the gate of the third transistor NM1, which is connected to the second node L. The first switching unit NM3 is connected between the first node N and the ground voltage terminal VSS.

In FIGS. 8 and 9, the third transistor NM1 and the fourth transistor NM2 are implemented with n-channel transistors. In addition, the first switching unit NM3 enables the second current mirror and is implemented with an n-channel transistor operating in response to a control signal K inputted to its gate.

Figure 10:
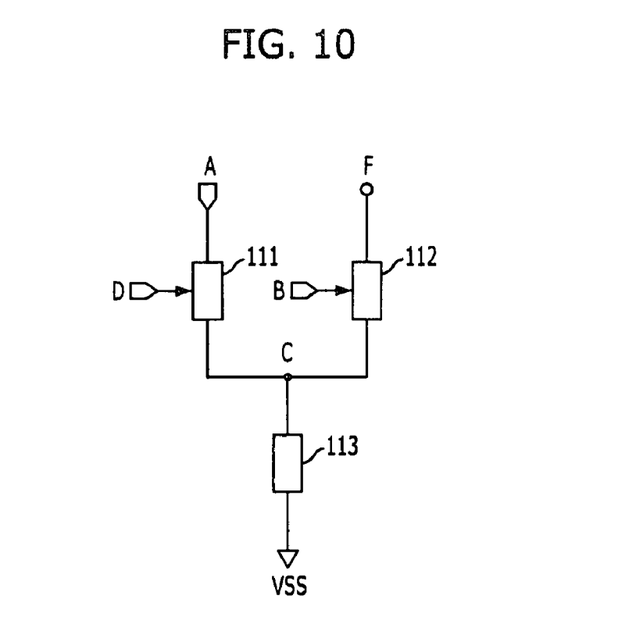
FIG. 10 is a circuit diagram of a unit cell 110 of FIG. 2.

In an example of the nonvolatile memory device, there is no limitation in the structure of the unit cell 110. For example, the unit cell 110 may include one antifuse and one switching unit. Alternatively, the unit cell 110 may include one antifuse and two switching units. As illustrated in FIG. 10, the unit cell 110 may have a parallel configuration of one antifuse 113 and two switching units 111 and 112.

Specifically, referring to FIG. 10, the unit cell 110 includes an antifuse 113, a third switching unit 111, and a fourth switching unit 112. The antifuse 113 is connected between a third node C and a ground voltage terminal VSS. The third switching unit 111 is connected between a first node A and the third node C and is configured to operate in response to a control signal inputted through a second input terminal D. The fourth switching unit 112 is connected between the third node C and an output terminal F (a terminal through which data is outputted in a read operation) and is configured to operate in response to a control signal inputted through a third input terminal B.

The third switching unit 111 may be implemented with a transistor being an active element for transferring a write voltage inputted through the first input terminal A to the third node C. The fourth switching unit 112 may be implemented with a transistor being an active element for transferring a read voltage to the third node C. In this case, the transistors may be n-channel transistors or p-channel transistors. Furthermore, the transistors may be high-voltage transistors or low-voltage transistors.

The antifuse 113 may be implemented with a transistor being an active element or a capacitor being a passive element. In this case, the transistor may be a p-channel transistor or an n-channel transistor. Specifically, the transistor has a gate connected to the third node C, and a drain and a source commonly connected to the ground voltage terminal VSS. Moreover, when the antifuse 113 is implemented with the capacitor, the capacitor has a first terminal, which is a top electrode, connected to the third node C, and a second terminal, which is a bottom electrode, connected to the ground voltage terminal VSS.

Referring to FIG. 10, the nonvolatile memory device has the parallel configuration of the antifuse 113 and the third and fourth switching units 111 and 112. Accordingly, by transferring the write voltage and the read voltage to the antifuse 113 through the different paths, the loss of the read voltage in the read operation may be minimized compared with the unit cell having the series configuration of the antifuse and the switching units. Thus, the data sensing margin at the output terminal of the unit cell may be secured to thereby improve the operational reliability of the nonvolatile memory device.

Figure 11:
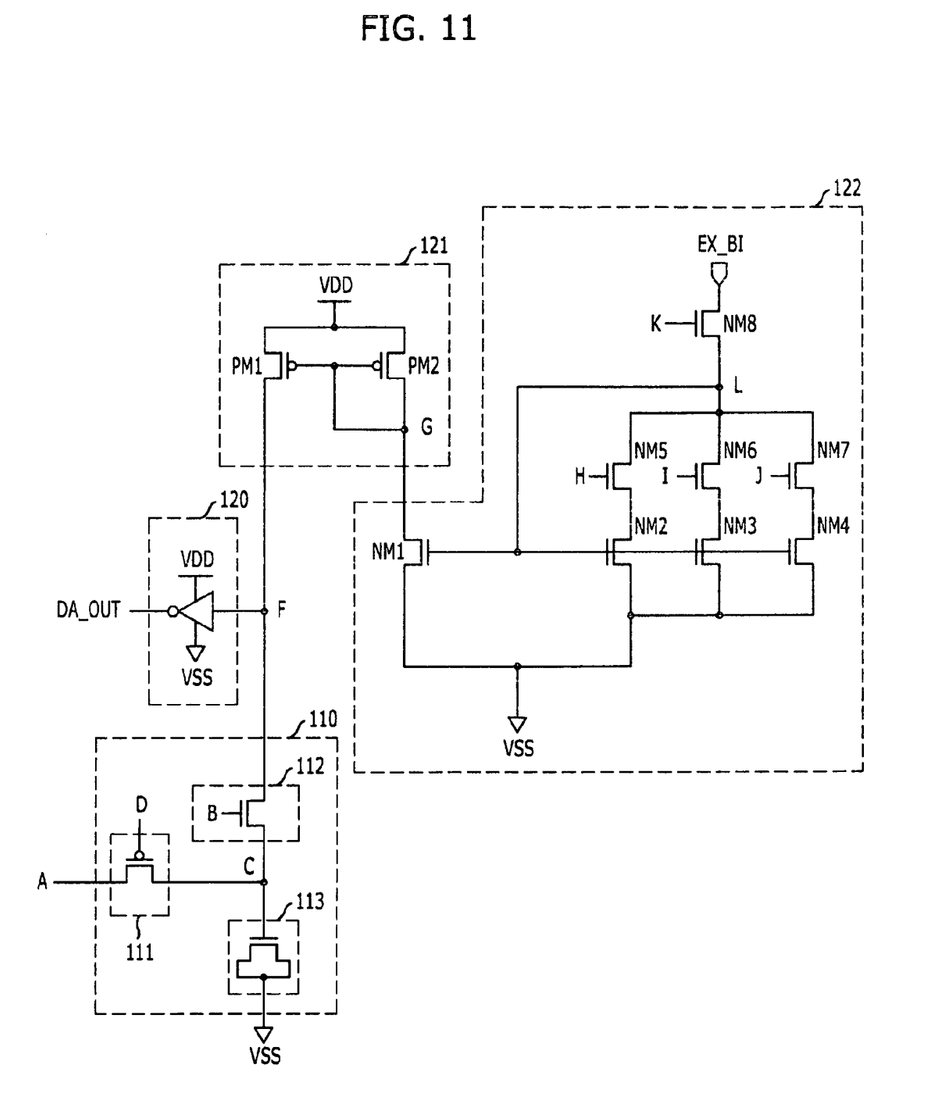
FIG. 11 is a circuit diagram illustrating an example of an explanation of an operation characteristic of the nonvolatile memory device.

The following description will be made on the write and read operations of an example of the unit cell of the nonvolatile memory device with reference to FIG. 11. Referring to FIG. 11, the third switching unit 111, the fourth switching unit 112, and the antifuse 113 are implemented with a p-channel transistor, an n-channel transistor, and an n-channel transistor, respectively. The variable current supplying unit 122 having the structure of FIG. 6 will be used as an example.

TABLE 2

| Mode | Terminal (Node) | | | | | | | |
| --- | --- | --- | --- | --- | --- | --- | --- | --- |
| | A | B | D | F | H | I | J | K |
| Write Operation | VPP | L | L | — | — | — | — | L |
| Read Operation | — | H | H | L | H | L | L | H |

In Table 2, "-" represents a logic high (H) or logic low (L) state, or a floating state.

The following description will be made with reference to Table 2 and FIG. 11.

Write Operation

First, the high voltage VPP is applied to the first input terminal A, and a logic low signal is inputted to the second input terminal D and the third input terminal B. Due to those conditions, the third switching unit 111 is turned on, and the fourth switching unit 112 is turned off. Accordingly, the first input terminal and the node C are electrically connected, and the node C and the output terminal F are electrically opened so that the high voltage VPP is transferred to the antifuse 113 through the third switching unit 111. Thus, dielectric breakdown occurs in a gate dielectric layer formed between the gate of the antifuse 113 and the substrate.

Read Operation

After the completion of the write operation, a logic high signal is inputted to the second input terminal D and the third input terminal B. In addition, the control signals H and K having a logic high state are inputted to the first switching unit NM5 and the second switching unit NM8. Due to those conditions, the third node C and the output terminal F are electrically connected so that a current path is formed between the output terminal F and the antifuse 113.

Furthermore, the second switching unit MN8 is turned on to enable the second current mirror of the variable current supplying unit 122. Accordingly, the external bias EX_BI is transferred to the first node L through the second switching unit NM8, and the third transistor NM1 is turned on by the external bias EX_BI. Moreover, since only the switching unit NM5 among the first switching units NM5 to NM7 is turned on, only the transistor NM2 among the fourth transistors NM2 to NM4 is turned on by the external bias EX_BI.

Since the third transistor NM1 is turned on by the external bias EX_BI, the potential corresponding to the ground voltage is applied to the input terminal G of the first current mirror 121. In this case, the potential of the input terminal G of the first current mirror 121 increases or decreases in correspondence to a drain current of the transistor NM2.

That is, since the third transistor NM1 and the fourth transistor NM2 form a current mirror, a drain current of the third transistor NM1 (a current flowing through the input terminal of the first current mirror) is determined by the drain current of the fourth transistor NM2. The drain current of the third transistor NM1 decreases when the drain current of the fourth transistor NM2 decreases, and increases when the drain current of the fourth transistor NM2 increases.

The first transistor PM1 and the second transistor PM2 are turned on by the variable current (the drain current of the third transistor NM1) inputted to the input terminal G of the first current mirror 121. Accordingly, the input voltage applied from the power supply voltage terminal VDD drops down by a threshold voltage of the first transistor PM1.

That is, the read voltage transferred to the output terminal F is equal to "the power supply voltage—the threshold voltage of the first transistor PM1". At this point, the threshold voltage of the first transistor PM1 is determined by the potential of the input terminal G of the first current mirror 121. The threshold voltage of the first transistor PM1 decreases as the potential of the input terminal G decreases, and increases as the potential of the input-terminal G increases.

After the write operation, the antifuse 113 of the unit cell 110 becomes a dielectric breakdown state. For this reason, a current path is formed between the output terminal F and the ground voltage terminal VSS. Therefore, the read voltage flows to the ground voltage terminal VSS through the second switching unit 112 and the antifuse 113, so that the output terminal F has a potential corresponding to the ground voltage. Consequently, the inverter-type detecting unit 120 outputs an output signal DA_OUT having a logic high state.

Meanwhile, after the write operation, the antifuse 113 of the unit cell 110 must have a resistance of about 100Ω to 300Ω when its dielectric normally or stably breaks down. However, if the dielectric breakdown of the antifuse 113 does not normally occur after the write operation, the antifuse 113 has a high resistance of about 1 MΩ. If the antifuse 113 has the high resistance of about 1 MΩ after the write operation, the read voltage inputted to the output terminal F does not normally flow to the ground voltage terminal VSS through the antifuse 113.

Accordingly, since the potential corresponding to the read voltage is applied to the output terminal F, the detecting unit 120 of the unit cell 110 outputs the output signal DA_OUT having a logic low state. That is, when the read operation on the unit cell 110 is normally completed, the detecting unit 120 must output the output signal DA_OUT having a logic high state. However, due to the high resistance of the antifuse 113, the detecting unit 120 outputs the output signal DA_OUT having a logic low state.

Therefore, there is proposed a method which stably detects data of the unit cell 110 even when the antifuse 113 has the high resistance. In the read operation, the potential of the input terminal G of the first current mirror 121 is varied using the variable current supplying unit 122, and the threshold voltage of the first transistor PM1 is controlled by the varied potential. In this way, the read voltage transferred to the output terminal F is appropriately varied.

Referring to FIG. 11, the potential of the input terminal G of the first current mirror 121 corresponds to the drain current of the third transistor NM1, and the drain current of the third transistor NM1 is determined by the number of the turned-on transistors among the fourth transistors NM2 to NM4. That is, when the number of the turned-on transistors among the fourth transistors NM2 to NM4 is increased, the drain current of the third transistor NM1 is increased. When the number of the turned-on transistors among the fourth transistors NM2 to NM4 is decreased, the drain current of the third transistor NM1 is decreased.

As described above, the read voltage can be varied by adjusting the threshold voltage of the first transistor PM1 through the variable current supplying unit 122. That is, when the resistance of the antifuse 113 is high, the read voltage transferred to the output terminal F is reduced by increasing the threshold voltage of the first transistor PM1. When the resistance of the antifuse 113 is low, the read voltage is increased by reducing the threshold voltage of the first transistor PM1.

For example, in the case where the dielectric breakdown of the antifuse 113 occurs normally, the data signal DA_OUT having a logic high state is outputted when only the transistor NM2 among the fourth transistors NM2 to NM4 is turned on. However, in the case where the dielectric breakdown of the antifuse 113 does not occur normally, the data signal DA_OUT having a logic low state instead of a logic high state is outputted when only the transistor NM2 among the fourth transistors NM2 to NM4 is turned on.

When the antifuse 113 has a high resistance (for example, more than 300Ω) due to an abnormal dielectric breakdown, the transistors NM3 and NM4 among the fourth transistors NM2 to NM4 are sequentially turned on in correspondence to the magnitude of the high resistance, so that the drain current of the third transistor NM1 is increased.

When the drain current of the third transistor NM1 is increased, the potential of the input terminal of the first current mirror 121 is increased and thus the potential of the read voltage transferred to the output terminal F is reduced. At this point, the potential of the read voltage is reduced to the level corresponding to the potential when the dielectric breakdown of the antifuse 113 occurs normally through the detecting unit 120.

Hereinafter, an example of the memory cell array of the nonvolatile memory device will be described.

Figure 12:
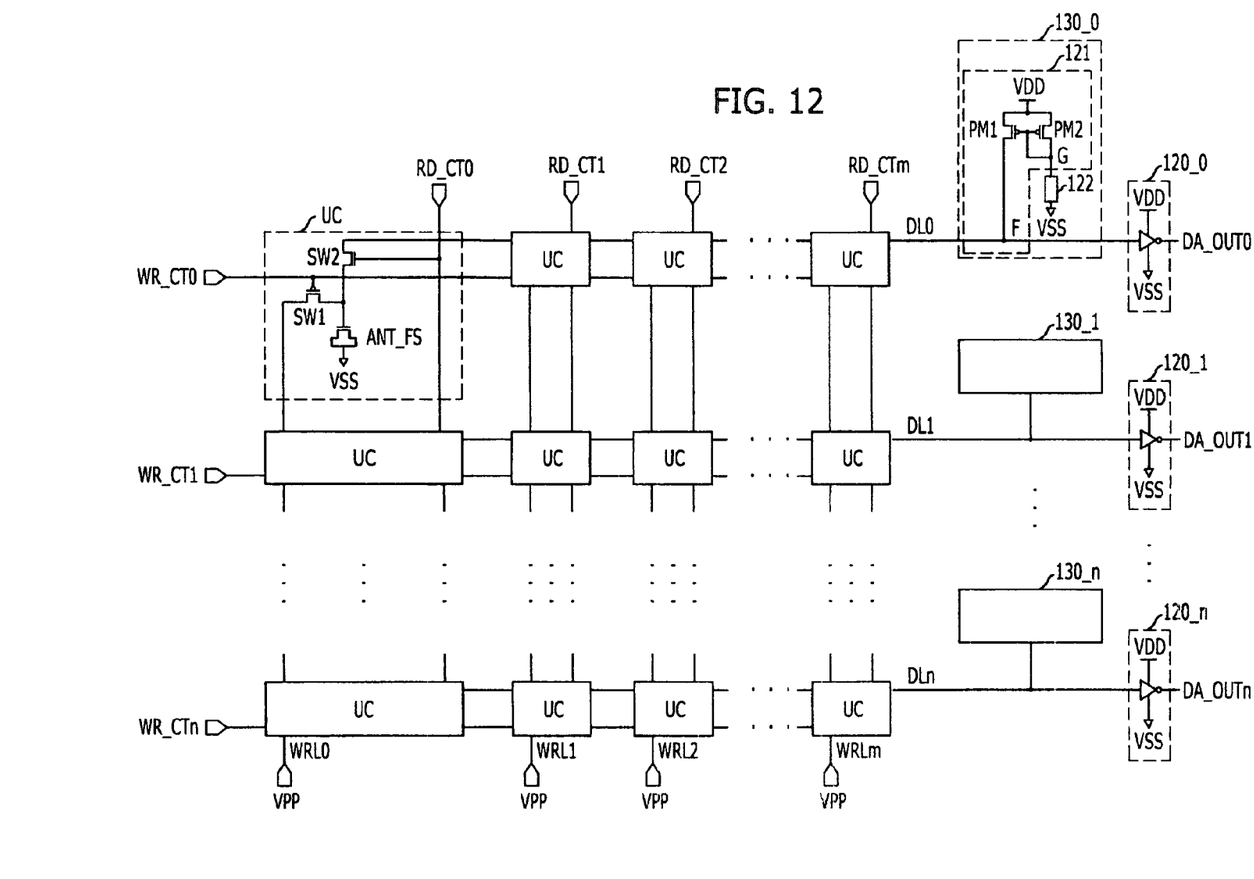
FIGS. 12 to 14 are configuration diagrams illustrating an examples of memory cell arrays of the nonvolatile memory device.

FIG. 12 is a configuration diagram of illustrating an example the memory cell array of the nonvolatile memory device.

Referring to FIG. 12, an example of the memory cell array of the nonvolatile memory device includes a plurality of unit cells UC arranged in a matrix type. Each of the unit cells UC includes two switching units SW1 and SW2 and one antifuse ANT_FS. As one example, in the unit cell UC, the third switching unit SW1 and the fourth switching unit SW2 are implemented with a p-channel transistor and an n-channel transistor, respectively.

In addition, an example of the memory cell array of the nonvolatile memory device includes a plurality of write driving lines, WR_CT0 to WR_CTn (where n is a natural number), for selecting the third switching units SW1 of the unit cells UC, and a plurality of read driving lines RD_CT0 to RD_CTm (where m is a natural number) for selecting the fourth switching units SW2 of the unit cells UC.

The write driving lines WR_CT0 to WR_CTn extend in a row direction and are connected to the respective third switching units SW1 of the unit cells UC arranged in a row direction, that is, gates of the p-channel transistors. The read driving lines RD_CT0 to RD_CTm extend in a column direction to cross the write driving lines WR_CT0 to WR_CTn, and are connected to the respective fourth switching units SW2 of the unit cells UC arranged in a column direction, that is, gates of the n-channel transistors.

Furthermore, the memory cell array of the nonvolatile memory device includes data lines DL0 to DLn (where n is a natural number) for transferring the read voltage the unit cells UC in the read operation and transferring data outputted from the unit cells UC to the detecting units 120_0 to 120_n (where n is a natural number) in the read operation, and write voltage supplying lines WRL0 to WRLm (where m is a natural number) for transferring the write voltage to the unit cells UC in the write operation.

The data lines DL0 to DLn extend in a row direction and are connected to the output terminals F of the unit cells UC arranged in a row direction and the input terminals of the detecting units 120_0 to 120_n. The data lines DL0 to DLn transfer the read voltage from the read voltage varying units 130_0 to 130_n to the fourth switching units SW2 in the read operation, and transfer data outputted from the output terminals F to the corresponding detecting units 120_0 to 120_n.

The write data lines WRL0 to WRLn extend in a column direction and are commonly connected to the respective third switching units SW1 of the unit cells UC arranged in a column direction. The write voltage supplying lines WRL0 to WRLn transfer the write voltage, that is, the high voltage VPP, to the third switching units SW1 of the unit cells UC arranged in a column direction in the write operation.

Furthermore, an example of the memory cell array of the nonvolatile memory device includes the plurality of detecting units 120_0 to 120_n arranged in the respective data lines DL0 to DLn to detect data outputted through the corresponding data lines DL0 to DLn. The detecting units 120_0 to 120_n may be implemented with inverters or differential amplifiers. Since the inverters have a simple circuit configuration, they may be advantageous in view of the reduction of the circuit area and power consumption.

An example of the memory cell array of the nonvolatile memory device includes the read voltage varying units 130_0 to 130_n varying the power supply voltage in the read operation and transferring the varied read voltage to the corresponding data lines DL0 to DLn. In this case, the read voltage varying units 130_0 to 130_n may have any one of the structures illustrated in FIGS. 3 to 9.

Figure 13:
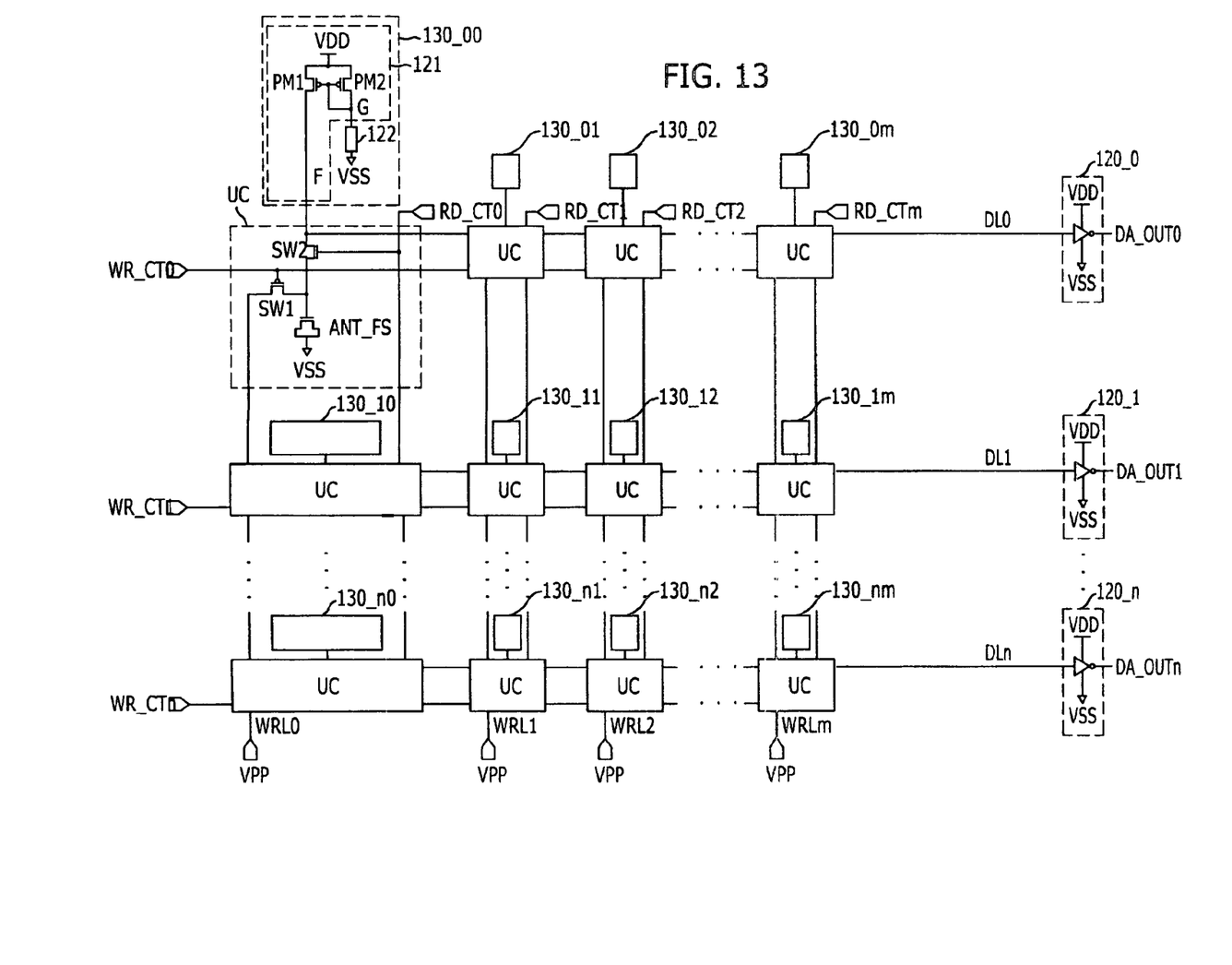

FIG. 13 is a configuration diagram illustrating another example of a memory cell array of a nonvolatile memory device.

Unlike the memory cell array of FIG. 12, the memory cell array of FIG. 13 has a structure in which read voltage varying units 130_00 to 130_nm are arranged corresponding to unit cells UC. Meanwhile, like in FIG. 12, detecting units 120_0 to 120_n are arranged corresponding to data lines DL0_DLn.

Figure 14:
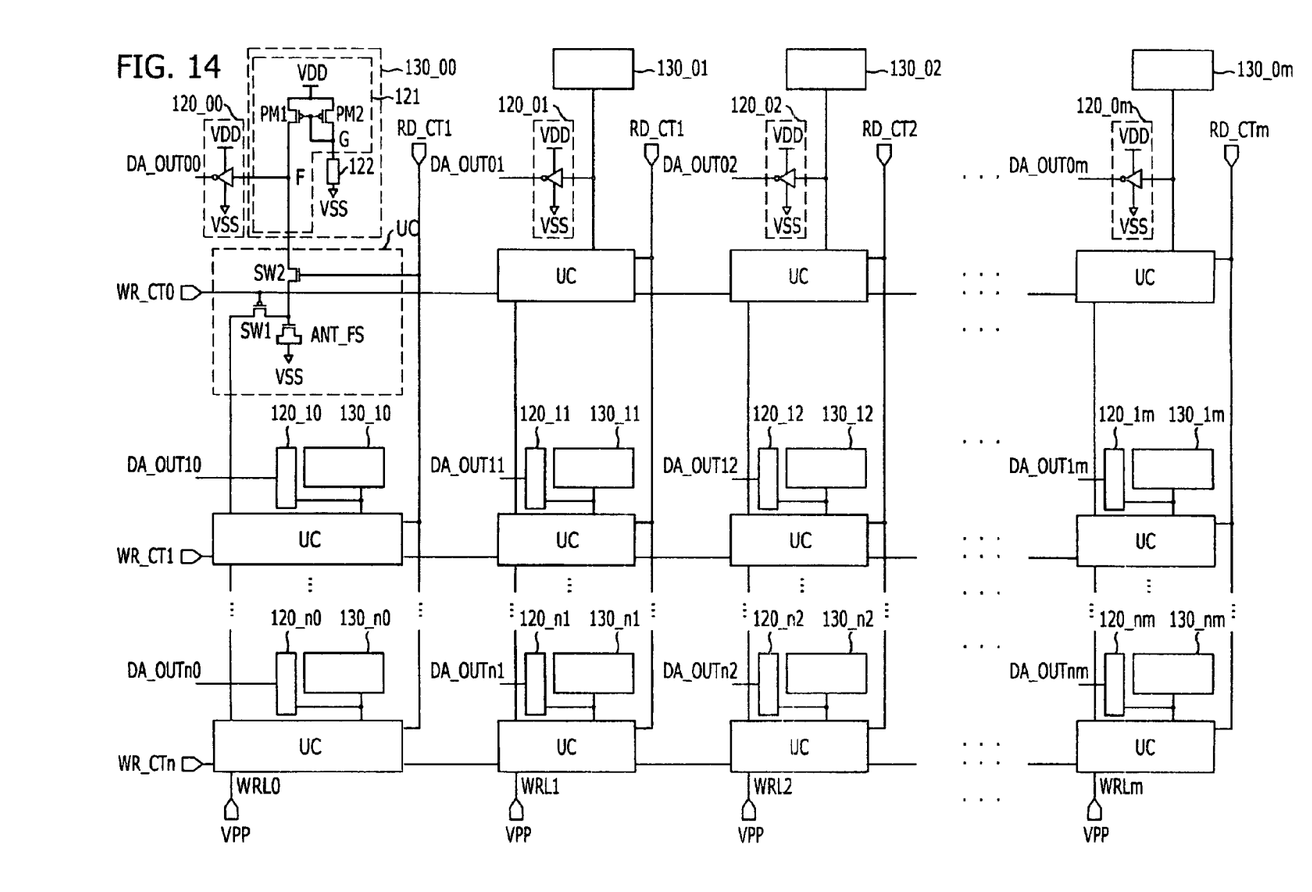

FIG. 14 is a configuration diagram illustrating another example of a memory cell array of a nonvolatile memory device.

Unlike the memory cell array of FIG. 13, the memory cell array of FIG. 14 has a structure in which detecting units 120_00 to 120_nm as well as read voltage varying units 130_00 to 130_nm are arranged corresponding to unit cells.

Accordingly, there is no need for a plurality of data lines DL0 to DLn (see FIG. 13) for commonly connecting the detecting units 120_00 to 120_nm to the output terminals of the unit cells UC arranged in a row direction. Consequently, the data sensing margin can be improved by minimizing the data loss occurring in the memory cell arrays of FIGS. 12 and 13, that is, the data loss caused by the resistances of the data lines.

The above-referenced examples may obtain the following effects.

First, by varying the input voltage in the read operation and supplying the read voltage having the varied level to the unit cells, the sensing margin may be increased and thus the cell data may be stably detected even when the unit cell has the high resistance due to the abnormal dielectric breakdown of the antifuse. Therefore, the nonvolatile memory device may be capable of preventing malfunctions caused by the high resistance of the unit cell, thereby improving the reliability of the read operation.

Second, by connecting the antifuse and the first and second switching units in parallel, the write voltage and the read voltage are transferred to the antifuse through the different paths. Therefore, the loss of the read voltage in the read operation may be minimized compared with the unit cell having the series configuration. Consequently, the sensing margin of the data detected through the output terminal of the unit cell can be increased, thereby improving the operational reliability of the nonvolatile memory device.

While examples have been described, it will be apparent to those skilled in the art that various changes and modifications may be made without departing from the scope of the following claims.

What is claimed is:

1. A nonvolatile memory device, comprising:
    a unit cell comprising an antifuse;
    a detecting unit configured to detect data from the unit cell; and
    a read voltage varying unit configured to vary an input voltage and supply a varied read voltage to the unit cell, the read voltage varying unit comprising:
        a first current mirror configured to receive the input voltage and supply the varied read voltage to the unit cell; and
        a variable current supplying unit configured to supply a variable current to an input terminal of the first current mirror, the variable current supply unit comprising a second current mirror configured to receive an external bias and supply the variable current to the input terminal of the first current mirror, the second current mirror comprising:
            a first transistor connected between the input terminal of the first current mirror and a first ground voltage terminal and having a gate connected to a first node; and
            a plurality of second transistors connected in parallel between the first node and the first ground voltage terminal and having a gate connected to the gate of the first transistor.

2. The nonvolatile memory device of claim 1, wherein the first current mirror comprises:
    a third transistor connected between a power supply voltage terminal and an output terminal of the unit cell and having a gate connected to the input terminal of the first current mirror; and
    a fourth transistor connected between an output terminal of the variable current supplying unit and the power supply voltage terminal and having a gate connected to the gate of the third transistor.

3. The nonvolatile memory device of claim 2, wherein the third transistor and the fourth transistor are implemented with p-channel transistors.

4. The nonvolatile memory device of claim 1, wherein the variable current supplying unit comprises a variable resistor.

5. The nonvolatile memory device of claim 1, wherein the external bias is a fixed voltage having a constant level.

6. The nonvolatile memory device of claim 1, wherein the second current mirror further comprises
   a plurality of first switching units connected in series between the respective second transistors and the first node and configured to transfer the external bias from the first node to the second transistors.

7. A nonvolatile memory device, comprising:
a unit cell comprising an antifuse;
a detecting unit configured to detect data from the unit cell; and
a read voltage varying unit configured to vary an input voltage and supply a varied read voltage to the unit cell, the read voltage varying unit comprising:
   a first current mirror configured to receive the input voltage and supply the varied read voltage to the unit cell; and
   a variable current supplying unit configured to supply a variable current to an input terminal of the first current mirror, the variable current supply unit comprising a second current mirror configured to receive an external bias and supply the variable current to the input terminal of the first current mirror, the second current mirror comprising:
      a first transistor connected between the input terminal of the first, current mirror and a first node and having a gate connected to a second node;
      a plurality of second transistors connected in parallel between the first node and the second node and having gates commonly connected to the gate of the first transistor; and
      a first switching unit connected between the first node and a ground voltage terminal.

8. The nonvolatile memory device of claim 1, wherein the second transistors have the same or different channel width and length.

9. The nonvolatile memory device of claim 1, wherein the external bias is a variable voltage which is varied with a constant voltage level.

10. The nonvolatile memory device of claim 1, wherein the second current mirror further comprises
   a second switching unit configured to transfer the external bias to the first node.

11. The nonvolatile memory device of claim 7, wherein the second current mirror further comprises
   a plurality of second switching units connected in series between the respective second transistors and the second node and configured to transfer the external bias from the second node to the second transistors.

12. The nonvolatile memory device of claim 1, wherein:
the antifuse is connected between a second node and a second ground voltage terminal; and
the unit cell further comprises:
   a first switching unit connected to the second node to transfer a write voltage to the second node; and
   a second switching unit connected between the second node and an output terminal of the unit cell to transfer the varied read voltage to the second node.

13. The nonvolatile memory device of claim 1, wherein the detecting unit comprises an inverter.

14. A nonvolatile memory device, comprising:
a cell array comprising a plurality of unit cells arranged in a matrix type, each of the unit cells comprising an antifuse;
a plurality of data lines commonly connected to output terminals of the unit cells;
a plurality of detecting units configured to detect data from the data lines, each of the detecting units being respectively connected to a corresponding one of the data lines; and
a read voltage varying unit configured to vary an input voltage and supply a varied read voltage to the data lines.

15. The nonvolatile memory device of claim 14, wherein the read voltage varying unit comprises:
   a first current mirror configured to receive the input voltage and supply the varied read voltage to the data lines; and
   a variable current supplying unit configured to supply a variable current to an input terminal of the first current mirror.

16. The nonvolatile memory device of claim 15, wherein the first current mirror comprises:
   a first transistor connected between a power supply voltage terminal and the data lines and having a gate connected to an output terminal of the variable current supplying unit; and
   a second transistor connected between the output terminal of the variable current supplying unit and the power supply voltage terminal and having a gate connected to the gate of the first transistor.

17. The nonvolatile memory device of claim 16, wherein the variable current supplying unit comprises:
   a plurality of resistors connected in series between the input terminal of the first current mirror and a ground voltage terminal; and
   a plurality of first switching units connected in parallel to the plurality of resistors, respectively.

18. The nonvolatile memory device of claim 16, wherein the variable current supplying unit comprises a plurality of transistors connected in parallel between the input terminal of the first current mirror and a ground voltage terminal.

19. The nonvolatile memory device of claim 16, wherein the variable current supplying unit comprises a second current mirror configured to receive an external bias and supply the variable current to the input terminal of the first current mirror.

20. The nonvolatile memory device of claim 19, wherein the external bias is a fixed voltage having a constant level.

21. The nonvolatile memory device of claim 20, wherein the second current mirror comprises:
   a third transistor connected between the input terminal of the first current mirror and a ground voltage terminal and having a gate connected to a node;
   a plurality of fourth transistors connected in parallel between the node and the ground voltage terminal and having a gate connected to the gate of the third transistor;
   a plurality of first switching units connected in series between the respective fourth transistors and the node and configured to transfer the external bias from the node to the fourth transistors; and
   a second switching unit configured to transfer the external bias to the node.

22. The nonvolatile memory device of claim 20, wherein the second current mirror comprises:
   a third transistor connected between the input terminal of the first current mirror and a first node and having a gate connected to a second node;
   a plurality of fourth transistors connected in parallel between the first node and the second node and having gates commonly connected to the gate of the third transistor;
   a plurality of first switching units connected in series between the respective fourth transistors and the second node and configured to transfer the external bias from the second node to the fourth transistors; and a second switching unit connected between the first node and a ground voltage terminal.

23. The nonvolatile memory device of claim 19, wherein the external bias is a variable voltage which is varied with a constant voltage level.

24. The nonvolatile memory device of claim 23, wherein the second current mirror comprises:
   a third transistor connected to the input terminal of the first current mirror and a ground voltage terminal and having a gate connected to a node;
   a fourth transistor connected between the node and the ground voltage terminal and having a gate connected to the gate of the third transistor; and
   a first switching unit configured to transfer the external bias to the node.

25. The nonvolatile memory device of claim 23, wherein the second current mirror comprises:
   a third transistor connected between the input terminal of the first current mirror and a first node and having a gate connected to a second node;
   a fourth transistor connected between the first node and the second node and having a gate connected to the gate of the third transistor; and
   a first switching unit connected between the first node and a ground voltage terminal.

26. A nonvolatile memory device, comprising:
   a cell array comprising a plurality of unit cells arranged in a matrix type, each of the unit cells comprising an antifuse;
   a plurality of data lines commonly connected to output terminals of the unit cells;
   a plurality of detecting units configured to detect data from the data lines; and
   a plurality of read voltage varying units configured to vary an input voltage and supply a varied read voltage to the data lines, each of the read voltage varying units being respectively connected to a corresponding one of the unit cells.

27. The nonvolatile memory device of claim 26, wherein each of the read voltage varying units comprise:
   a first current mirror configured to receive the input voltage and supply the read voltage to the data lines; and
   a variable current supplying unit configured to supply a variable current to an input terminal of the first current mirror.

28. The nonvolatile memory device of claim 27, wherein the first current mirror comprises:
   a first transistor connected between a power supply voltage terminal and the data lines and having a gate connected to an output terminal of the variable current supplying unit; and
   a second transistor connected between the output terminal of the variable current supplying unit and the power supply voltage terminal and having a gate connected to the gate of the first transistor.

29. The nonvolatile memory device of claim 28, wherein the variable current supplying unit comprises:
   a plurality of resistors connected in series between the input terminal of the first current mirror and a ground voltage terminal; and
   a plurality of first switching units connected in parallel to the plurality of resistors, respectively.

30. The nonvolatile memory device of claim 28, wherein the variable current supplying unit comprises a plurality of transistors connected in parallel between the input terminal of the first current mirror and a ground voltage terminal.

31. The nonvolatile memory device of claim 28, wherein the variable current supplying unit comprises a second current mirror configured to receive an external bias and supply the variable current to the input terminal of the first current mirror.

32. The nonvolatile memory device of claim 31, wherein the external bias is a fixed voltage having a constant level.

33. The nonvolatile memory device of claim 32, wherein the second current mirror comprises:
   a third transistor connected between the input terminal of the first current mirror and a ground voltage terminal and having a gate connected to a node;
   a plurality of fourth transistors connected in parallel between the node and the ground voltage terminal and having a gate connected to the gate of the third transistor;
   a plurality of first switching units connected in series between the respective fourth transistors and the node and configured to transfer the external bias from the node to the fourth transistors; and
   a second switching unit configured to transfer the external bias to the node.

34. The nonvolatile memory device of claim 32, wherein the second current mirror comprises:
   a third transistor connected between the input terminal of the first current mirror and a first node and having a gate connected to a second node;
   a plurality of fourth transistors connected in parallel between the first node and the second node and having gates commonly connected to the gate of the third transistor;
   a plurality of first switching units connected in series between the respective fourth transistors and the second node and configured to transfer the external bias from the second node to the fourth transistors; and
   a second switching unit connected between the first node and a ground voltage terminal.

35. The nonvolatile memory device of claim 31, wherein the external bias is a variable voltage which is varied with a constant voltage level.

36. The nonvolatile memory device of claim 35, wherein the second current mirror comprises:
   a third transistor connected to the input terminal of the first current mirror and a ground voltage terminal and having a gate connected to a node;
   a fourth transistor connected between the node and the ground voltage terminal and having a gate connected to the gate of the third transistor; and
   a first switching unit configured to transfer the external bias to the node.

37. The nonvolatile memory device of claim 35, wherein the second current mirror comprises:
   a third transistor connected between the input terminal of the first current mirror and a first node and having a gate connected to a second node;
   a fourth transistor connected between the first node and the second node and having a gate connected to the gate of the third transistor; and
   a first switching unit connected between the first node and a ground voltage terminal.

38. The nonvolatile memory device of claim 14, wherein:
   the antifuse is connected between a node and a ground voltage terminal; and
   each of the unit cells further comprise:
      a first switching unit connected to the node to transfer a write voltage to the node; and a second switching unit connected between the node and an output terminal of the unit cell to transfer the read voltage to the node.

39. The nonvolatile memory device of claim 38, further comprising:
a plurality of write driving lines configured to selectively control the first switching units of the unit cells;
a plurality of read driving lines configured to selectively control the second switching units of the unit cells; and
a plurality of write voltage supplying lines configured to supply a write voltage to the first switching units of the unit cells.

40. The nonvolatile memory device of claim 38, wherein the detecting unit comprises an inverter.

41. The nonvolatile memory device of claim 26, wherein:
the antifuse is connected between a node and a ground voltage terminal; and
each of the unit cells further comprise:
a first switching unit connected to the node to transfer a write voltage to the node; and
a second switching unit connected between the node and an output terminal of the unit cell to transfer the read voltage to the node.

42. The nonvolatile memory device of claim 41, further comprising:
a plurality of write driving lines configured to selectively control the first switching units of the unit cells;
a plurality of read driving lines configured to selectively control the second switching units of the unit cells; and
a plurality of write voltage supplying lines configured to supply a write voltage to the first switching units of the unit cells.

43. The nonvolatile memory device of claim 41, wherein the detecting unit comprises an inverter.

* * * * *